US010204701B2

United States Patent
Lee

(10) Patent No.: US 10,204,701 B2
(45) Date of Patent: Feb. 12, 2019

(54) NON-VOLATILE MEMORY DEVICE AND READ THRESHOLD VOLTAGE ADJUSTMENT METHOD FOR THE SAME

(71) Applicant: SK hynix Inc., Gyeonggi-do (KR)

(72) Inventor: Jae Yoon Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 9 days.

(21) Appl. No.: 15/785,641

(22) Filed: Oct. 17, 2017

(65) Prior Publication Data
US 2018/0268919 A1   Sep. 20, 2018

(30) Foreign Application Priority Data

Mar. 20, 2017   (KR) .................... 10-2017-0034828

(51) Int. Cl.
| | |
|---|---|
| G11C 29/52 | (2006.01) |
| G11C 29/02 | (2006.01) |
| G11C 11/56 | (2006.01) |
| G11C 29/42 | (2006.01) |

(52) U.S. Cl.
CPC .......... G11C 29/52 (2013.01); G11C 11/5642 (2013.01); G11C 29/021 (2013.01); G11C 29/028 (2013.01); G11C 29/42 (2013.01)

(58) Field of Classification Search
CPC .............................. G11C 29/52; G11C 29/021
See application file for complete search history.

(56) References Cited

U.S. PATENT DOCUMENTS

| | | | | |
|---|---|---|---|---|
| 9,270,296 B1* | 2/2016 | Nemati Anaraki | ........................ | |
| | | | | G06F 11/1008 |
| 2011/0182119 A1* | 7/2011 | Strasser | ................ | G11C 16/28 |
| | | | | 365/185.03 |
| 2012/0008386 A1* | 1/2012 | Chilappagari | ...... | G11C 11/5642 |
| | | | | 365/185.2 |
| 2014/0040704 A1* | 2/2014 | Wu | ..................... | G06F 11/1068 |
| | | | | 714/773 |
| 2017/0271031 A1* | 9/2017 | Sharon | ................... | G11C 29/42 |

FOREIGN PATENT DOCUMENTS

KR         1020180042974         4/2018

* cited by examiner

*Primary Examiner* — Ajay Ojha
(74) *Attorney, Agent, or Firm* — IP & T Group LLP

(57) ABSTRACT

An operating method for a data storage device may include: determining a displacement value based on section memory cell numbers regarding a plurality of threshold voltage sections divided by a first read voltage and second read voltages; determining an adjustment direction based on the displacement value; adjusting at least one reliability value corresponding to at least one threshold voltage section among the threshold voltage sections, positioned in the adjustment direction from the first read voltage; and performing an error correction operation on data read from memory cells based on the first read voltage, using reliability values corresponding to the threshold voltage sections.

18 Claims, 8 Drawing Sheets

NON-VOLATILE MEMORY DEVICE AND READ THRESHOLD VOLTAGE ADJUSTMENT METHOD FOR THE SAME

CROSS-REFERENCES TO RELATED APPLICATION

The present application claims priority under 35 U.S.C. § 119(a) to Korean application number 10-2017-0034828, filed on Mar. 20, 2017, which is incorporated herein by reference in its entirety.

BACKGROUND

1. Technical Field

Various embodiments generally relate to a data storage device, and more particularly, to a data storage device including a nonvolatile memory device.

2. Related Art

Data storage devices may store data provided by an external device in response to a write request. Data storage devices may also provide stored data to an external device in response to a read request. Examples of external devices that use data storage devices include computers, digital cameras, cellular phones and the like. Data storage devices may be embedded in an external device during manufacturing of the external devices or may be fabricated separately and then connected afterwards to an external device.

SUMMARY

In an embodiment, an operating method for a data storage device may include: determining a displacement value based on section memory cell numbers regarding a plurality of threshold voltage sections divided by a first read voltage and second read voltages; determining an adjustment direction based on the displacement value; adjusting at least one reliability value corresponding to at least one threshold voltage section among the threshold voltage sections, positioned in the adjustment direction from the first read voltage; and performing an error correction operation on data read from memory cells based on the first read voltage, using reliability values corresponding to the threshold voltage sections.

In an embodiment, an operating method for a data storage device may include: determining a displacement value of a first read voltage, based on a number of memory cells each having a threshold voltage less than the first read voltage; determining an adjustment direction based on the displacement value, when the displacement value is less than a threshold value; adjusting at least one reliability value corresponding to at least one threshold voltage section positioned in the adjustment direction from the first read voltage among a plurality of threshold voltage sections divided by second read voltages; and performing an error correction operation on data read from the memory cells based on the first read voltage, using reliability values corresponding to the threshold voltage sections.

In an embodiment, a storage device may include: a nonvolatile memory device comprising a plurality of memory cells; and a controller configured to determine a displacement value based on section memory cell numbers regarding a plurality of threshold voltage sections divided by a first read voltage and second read voltages, determine an adjustment direction based on the displacement value, adjust at least one reliability value corresponding to at least one threshold voltage section among the threshold voltage sections, positioned in the adjustment direction from the first read voltage, and perform an error correction operation on data read from memory cells based on the first read voltage, using reliability values corresponding to the threshold voltage sections.

In an embodiment, a storage device may include: a nonvolatile memory device comprising a plurality of memory cells; and a controller configured to determine a displacement value of a first read voltage based on a number of memory cells each having a threshold voltage less than the first read voltage, determine an adjustment direction based on the displacement value when the displacement value is less than a threshold value, adjust at least one reliability value corresponding to at least one threshold voltage section positioned in the adjustment direction from the first read voltage among a plurality of threshold voltage sections divided by second read voltages, and perform an error correction operation on data read from the memory cells based on the first read voltage, using reliability values corresponding to the threshold voltage sections.

In an embodiment, the controller is configured to determine the displacement value by determining a ratio of a difference between the number and a reference number with respect to a unit number, as the displacement value. The reference number includes a number of memory cells which are expected to have a threshold voltage less than the first read voltage, when threshold voltage distributions of the memory cells are uniform and the first read voltage is an ideal read voltage. The unit number includes a number of memory cells which are expected to be positioned in a single threshold voltage distribution, when the threshold voltage distributions are uniform.

BRIEF DESCRIPTION OF THE DRAWINGS

The above and other features and advantages of the present invention will become more apparent to those skilled in the art to which the present invention belongs by describing various embodiments thereof with reference to the attached drawings in which.

DETAILED DESCRIPTION

Figure 1:
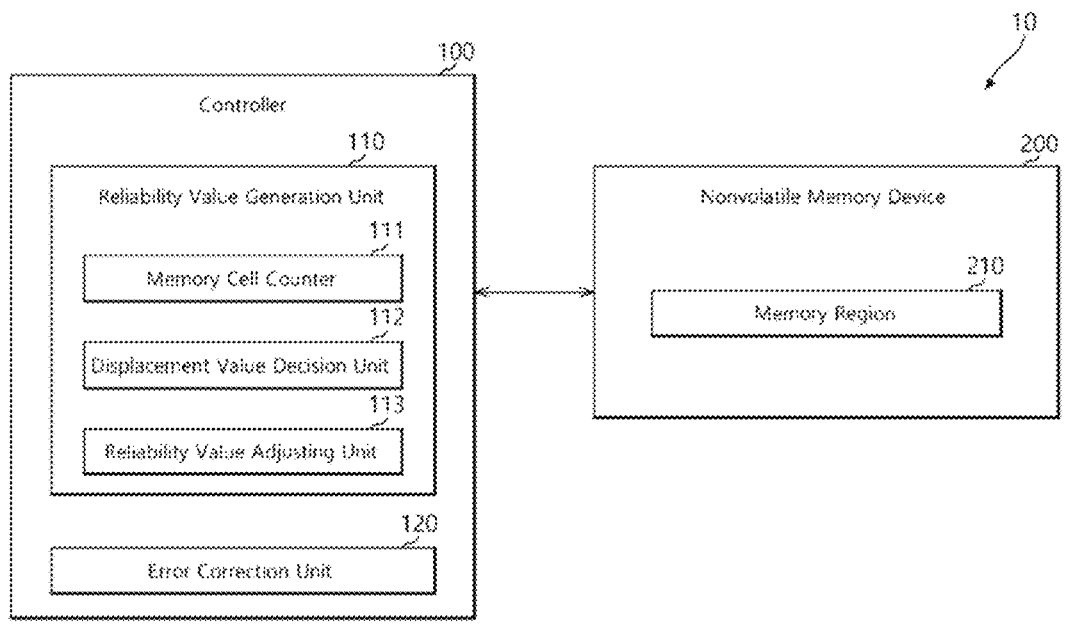
FIG. 1 is a block diagram illustrating a data storage device in accordance with an embodiment.

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a data storage device 10 in accordance with an embodiment.

The data storage device 10 may be configured to store data provided from an external device, in response to a write request of the external device. Furthermore, the data storage device 10 may be configured to provide the stored data to the external device, in response to a read request of the external device.

The data storage device 10 may include a Personal Computer Memory Card International Association (PCMCIA) card, a Compact Flash (CF) card, a smart media card, a memory stick, various multimedia cards (for example, MMC, eMMC, RS-MMC, and MMC-Micro), various secure digital cards (for example, SD, Mini-SD, and Micro-SD), a Universal Flash Storage (UFS), a Solid State Drive (SSD) and the like.

The data storage device 10 may include a controller 100 and a nonvolatile memory device 200.

The controller 100 may control overall operations of the data storage device 10. The controller 100 may store data in the nonvolatile memory device 200 in response to a write request received from the external device, or read data stored in the nonvolatile memory device 200 and output the read data to the external device, in response to a read request received from the external device.

The controller 100 may include a reliability value generation unit 110 and an error correction unit 120.

The reliability value generation unit 110 may allocate reliability values to the respective bits of data read from the nonvolatile memory device 200. Each of the reliability values may indicate the reliability of the corresponding bit, and be used for an error correction operation of the error correction unit 120 for the read data.

The nonvolatile memory device 200 may use one or more read voltages to read data stored therein. At this time, since the read data include error bits depending on the level of a read voltage, the level of the read voltage may have a close relation to the performance of the read operation. The reliability value generation unit 110 in accordance with the present embodiment may determine a first displacement value of a current read voltage with respect to a read voltage to minimize error bits, that is, an ideal read voltage, and perform a first reliability value adjusting operation for adjusting one or more preset reliability values according to the first displacement value.

The reliability value generation unit 110 may include a memory cell counter 111, a displacement value decision unit 112 and a reliability value adjusting unit 113.

The memory cell counter 111 may count and determine section memory cell number for each of threshold voltage sections divided by a first read voltage and second read voltages. The section memory cell number may indicate the number of memory cells positioned in the corresponding threshold voltage section. At this time, the first read voltage may include a hard decision read voltage, and the second read voltages may include soft decision read voltages. The memory cell counter 111 may count and determine section memory cell numbers for threshold voltage sections based on data read from the memory cells, using the first read voltage and the second read voltages.

The displacement value decision unit 112 may determine a first displacement value of the first read voltage based on the section memory cell numbers. In some embodiments, the displacement value decision unit 112 may select at least one pair including at least one left threshold voltage section and at least one right threshold voltage section among threshold voltage sections, and determine a difference between the section memory cell number of the left threshold voltage section of the pair and the section memory cell number of the right threshold voltage section of the pair to the first displacement value.

In an embodiment, the reliability value adjusting unit 113 may perform the first reliability value adjusting operation based on the first displacement value. Specifically, the reliability value adjusting unit 113 may determine an adjustment direction based on the first displacement value, and adjust at least one reliability value corresponding to at least one threshold voltage section positioned in the adjustment direction from the first read voltage. In some embodiments, the adjustment direction may indicate the direction in which the first read voltage is out of an ideal read voltage. The reliability value adjusting unit 113 may adjust a preset reliability value by increasing the absolute value of the reliability value.

The error correction unit 120 may perform an error correction operation on data read from the nonvolatile memory device 200, based on reliability values allocated to the data. The error correction operation may indicate a soft-decision decoding operation.

In another embodiment, the reliability value generation unit 110 may determine a second displacement value of the first read voltage, and perform the first reliability value adjusting operation or a second reliability value adjusting operation, depending on the second displacement value.

Specifically, the displacement value decision unit 112 may determine the second displacement value based on a first number. In some embodiments, the first number may be the number of memory cells having a smaller threshold value than the first read voltage. Furthermore, the reliability value adjusting unit 113 may perform the first reliability value adjusting operation based on the second displacement value, when the second displacement value is less than a predetermined threshold value.

However, the reliability value adjusting unit 113 may perform the second reliability value adjusting operation instead of the first reliability value adjusting operation, when the second displacement value is greater than or equal to the predetermined threshold value. Specifically, the reliability value adjusting unit 113 may determine second displacement values of second read voltages, determine the average of displacement values of the threshold voltage sections based on the second displacement value of the first read voltage and the second displacement values of the second read voltages, and adjust at least one reliability value corresponding to the threshold voltage sections based on the average of the displacement values.

The nonvolatile memory device 200 may store data received from the controller 100, or read the stored data and transmit the read data to the controller 100, according to control of the controller 100. The nonvolatile memory device 200 may include a memory region 210 for storing data. The memory region may include a plurality of memory cells.

The nonvolatile memory device 200 may include a flash memory, such as a NAND flash or a NOR flash, a Ferro-electrics Random Access Memory (FeRAM), a Phase-Change Random Access Memory (PCRAM), a Magnetoresistive Random Access Memory (MRAM), a Resistive Random Access Memory (ReRAM), and the like.

For the illustration purposes only, FIG. 1 illustrates that the data storage device 10 includes one nonvolatile memory device 200, but the number of nonvolatile memory devices included in the data storage device 10 is not limited thereto.

Figure 2:
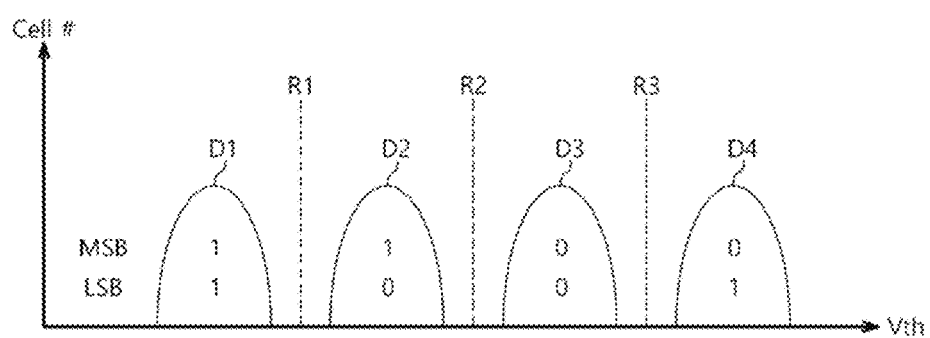
FIG. 2 is a diagram illustrating threshold voltage distributions of memory cells included in a memory region shown in FIG. 1.

FIG. 2 is a diagram illustrating threshold voltage distributions D1 to D4 of the memory cells included in the memory region 210 of FIG. 1. In FIG. 2 and FIGS. 3 to 9 below, the horizontal axis Vth may represent the threshold voltages of memory cells, and the vertical axis Cell # may indicate the numbers of memory cells for the threshold voltages.

Referring to FIG. 2, the memory cells may form the threshold voltage distributions D1 to D4 depending on data stored therein. For example, when data "11" is stored in a memory cell, the memory cell may have a threshold voltage corresponding to the threshold voltage distribution D1. Thus, the memory cell with data "11" may be positioned in the threshold voltage distribution D1. Furthermore, when data "10" is stored in a memory cell, the memory cell may have a threshold voltage corresponding to the threshold voltage distribution D2. Thus, the memory cell with data "10" may be positioned in the threshold voltage distribution D2. Furthermore, when data "00" is stored in a memory cell, the memory cell may have a threshold voltage corresponding to the threshold voltage distribution D3. Thus, the memory cell with data "00" may be positioned in the threshold voltage distribution D3. Furthermore, when data "01" is stored in a memory cell, the memory cell may have a threshold voltage corresponding to the threshold voltage distribution D4. Thus, the memory cell with data "01" may be positioned in the threshold voltage distribution D4. In FIG. 2, "MSB" may represent the most significant bit, and "LSB" may represent the least significant bit.

The number of bits stored in each memory cell is not limited to two bits as illustrated in FIG. 2. When i bits are stored in each of memory cells, the memory cells may form $2^i$ threshold voltage distributions.

When a predetermined read voltage is applied to a memory cell, the memory cell may be turned on or off depending on whether the threshold voltage thereof is less or greater than the read voltage. As the memory cell is turned on or off, the nonvolatile memory device 200 may acquire specific data for the memory cell. Specifically, the nonvolatile memory device 200 may acquire data for the memory cell by applying different levels of read voltages R1 to R3 to the memory cell, and determine whether the threshold voltage of the memory cell is less or greater than the read voltages R1 to R3, based on the corresponding data. That is, the nonvolatile memory device 200 can determine where the memory cell is positioned in the threshold voltage distributions D1 to D4 divided by the read voltages R1 to R3. For example, the nonvolatile memory device 200 may acquire data by applying the read voltages R1 to R3 to a certain memory cell. When determining that the corresponding memory cell has a threshold voltage greater than the read voltage R2 and less than the read voltage R3, based on the acquired data, the nonvolatile memory device 200 may determine that the memory cell is positioned in the threshold voltage distribution D3. Based on this determination, the nonvolatile memory device 200 may determine that the data stored in the corresponding memory cell is "00", and transmit the data "00" to the controller 100 in response to a read command for the memory cell.

When the threshold voltage distributions D1 to D4 are clearly divided by the read voltages R1 to R3 as illustrated in FIG. 2, the operation of reading data stored in the memory cells using the read voltages R1 to R3 may generate no error bits. Therefore, the nonvolatile memory device 200 may perform a write operation such that the memory cells form the threshold voltage distributions D1 to D4, and perform a read operation using the read voltages R1 to R3, under an expectation that the memory cells will form the threshold voltage distributions D1 to D4. As described later, however, the threshold voltage distributions D1 to D4 may be moved. As a result, the threshold voltage distributions D1 to D4 may not be clearly divided by the preset read voltages R1 to R3.

Figure 3:
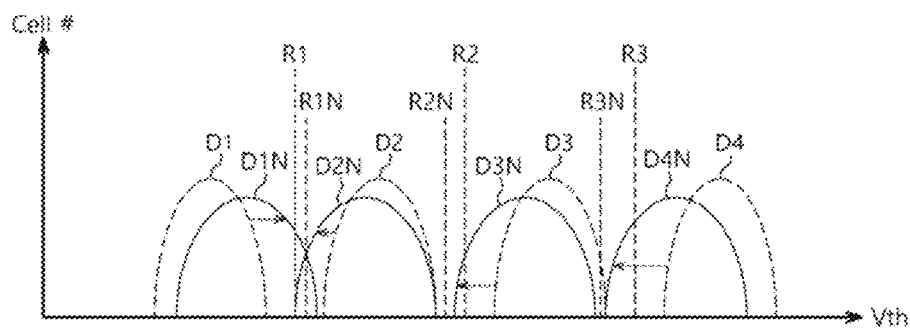
FIG. 3 is a diagram illustrating a method for adjusting read voltages when threshold voltage distributions are moved.

FIG. 3 is a diagram illustrating a method for adjusting the read voltages R1 to R3 when the threshold voltage distributions D1 to D4 are moved.

Referring to FIG. 3, the threshold voltage distributions D1 to D4 may be moved to threshold voltage distributions D1N to D4N and overlap each other, with the lapse of time or due to various reasons, even though the threshold voltage distributions D1 to D4 were clearly divided by the preset read voltages R1 to R3 through a successful write operation. In this case, the preset read voltages R1 to R3 need to be adjusted to read voltages R1N to R3N to be positioned between the moved threshold voltage distributions D1N to D4N, respectively. Since the operation of adjusting the read voltages R1 to R3 to the read voltages R1N to R3N can be performed through various existing methods, the detailed descriptions thereof may be omitted herein.

However, since actual threshold voltage distributions do not have smooth outlines as illustrated in FIGS. 2 and 3, it may be difficult to accurately adjust the read voltages R1 to R3 between the threshold voltage distributions D1N to D4N, respectively. Furthermore, when the threshold voltage distributions D1N to D4N overlap each other like the threshold voltage distributions D1N and D2N, a read operation for data corresponding to the overlap part may generate error bits. Therefore, as described later, the error correction unit 120 shown in FIG. 1 may perform an error correction operation on read data based on the preset read voltages or adjusted read voltages from the nonvolatile memory device 200.

Figure 4:
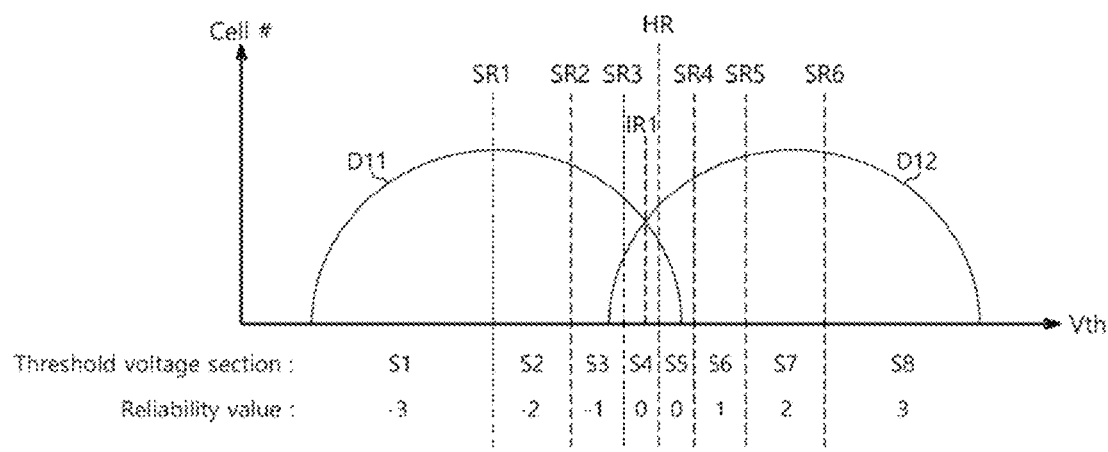
FIG. 4 is a diagram illustrating an error correction operation on data read from a nonvolatile memory device.

FIG. 4 is a diagram illustrating an error correction operation on data read from the nonvolatile memory device 200. For illustration purposes only, FIG. 4 illustrates threshold voltage distributions D11 and D12 corresponding to any two adjacent threshold voltage distributions among the threshold voltage distributions D1N to D4N of FIG. 3.

Referring to FIG. 4, a first read voltage HR may include a read voltage which is considered to be positioned in the valley between the threshold voltage distributions D11 and D12. For example, the first read voltage HR may include a read voltage preset in the nonvolatile memory device 200. Furthermore, as described with reference to FIG. 3, the first read voltage HR may correspond to a read voltage adjusted to the valley between the threshold voltage distributions D11 and D12 from the read voltage preset in the nonvolatile memory device 200. In FIG. 4, the first read voltage HR may not coincide with a read voltage which is accurately positioned in the valley between the threshold voltage distributions D11 and D12, that is, an ideal read voltage IR1. The ideal read voltage IR1 may indicate a read voltage capable of minimizing an occurrence of error bits during a read operation.

When data hereafter, soft decision data, are read from memory cells based on the first read voltage HR, an error correction operation may be performed through a soft-decision decoding method that additionally uses second read voltages SR1 to SR6. The second read voltages SR1 to SR6 may be set to levels which are less or greater by preset offset values than the first read voltage HR. For illustration purpose, FIG. 4 illustrates six second read voltages SR1 to SR6, but the number of second read voltages is not limited thereto.

The soft-decision decoding operation may be described in detail as follows. First, the controller 100 shown in FIG. 1 may read data hereafter, soft decision data, from memory cells based on the second read voltages SR1 to SR6 in a similar manner to the read operation based on the first read voltage HR. The reliability value generation unit 110 may determine where the memory cells are positioned in threshold voltage sections S1 to S8 divided by the second read voltages SR1 to SR6, through the soft decision data. At this time, the threshold voltage sections S1 to S8 may correspond to preset reliability values, respectively, as illustrated in FIG. 4. For example, the threshold voltage section S1 may correspond to reliability value "−3", the threshold voltage section S2 may correspond to reliability value "−2", the threshold voltage section S3 may correspond to reliability value "−1", the threshold voltage section S4 may correspond to reliability value "0", the threshold voltage section S5 may correspond to reliability value "0", the threshold voltage section S6 may correspond to reliability value "1", the threshold voltage section S7 may correspond to reliability value "2", and the threshold voltage section S8 may correspond to reliability value "3". Depending on the threshold voltage section where a memory cell is positioned, the reliability value generation unit 110 may allocate a reliability value to the corresponding memory cell or soft decision data read from the corresponding memory cell. The error correction unit 120 may perform a soft-decision decoding operation in consideration of the soft decision data and the reliability values allocated to the soft decision data.

The reliability value may indicate a log likelihood ratio for data, that is, the corresponding soft decision data. According to the characteristics of the reliability value, the absolute value of the reliability value may indicate the reliability of the corresponding soft decision data. That is, when the absolute value of the reliability value is large, it may indicate that the reliability of the corresponding soft decision data is high or the occurrence probability of error bits is low. The sign of the reliability value may be determined according to the probability that the corresponding soft decision data is "0" or "1". For example, a negative reliability value may indicate that the probability that the corresponding soft decision data is "1" is relatively high, and a positive reliability value may indicate that the probability that the corresponding soft decision data is "0" is relatively high.

Since the reliability value is directly related to the performance of the soft-decision decoding operation, the threshold voltage sections S1 to S8 need to correspond to appropriate reliability values. In particular, since the threshold voltage sections S4 and S5 where the threshold voltage distributions D11 and D12 considerably overlap each other generate many error bits, the threshold voltage sections S4 and S5 may correspond to reliability values having a small absolute value such as "0". Therefore, as the threshold voltage sections S1 to S8 are close to the first read voltage HR, the threshold voltage sections S1 to S8 may be set to correspond to the reliability values having a small absolute value. Such settings may be based on an expectation that the first read voltage HR will not be out of the ideal read voltage IR1.

Figure 5:
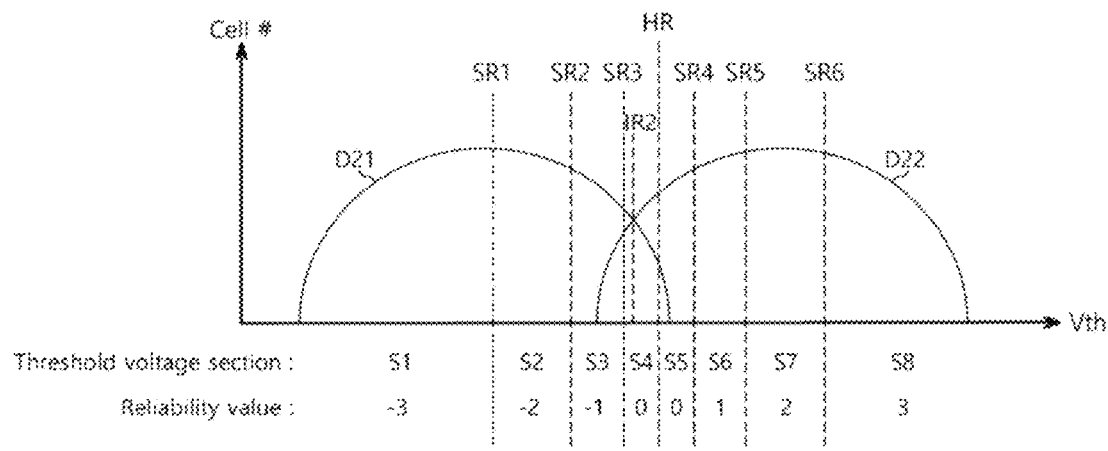
FIG. 5 is a diagram illustrating reliability values allocated to different threshold voltage distributions.

FIG. 5 is a diagram illustrating reliability values allocated to other threshold voltage distributions D21 and D22. FIG. 5 illustrates a situation in which the first read voltage HR is significantly out of an ideal read voltage IR2 of the threshold voltage distributions D21 and D22, such that the preset reliability values become inappropriate.

As described above, it may be difficult to adjust the first read voltage HR to the valley between the threshold voltage distributions D21 and D22. Thus, as illustrated in FIG. 5, the first read voltage HR may be significantly out of the ideal read voltage IR2. As a result, the second read voltages SR1 to SR6 and the threshold voltage sections S1 to S8 may be determined according to the first read voltage HR which was incorrectly adjusted, and the reliability values corresponding to the threshold voltage sections S1 to S8 may be allocated to soft decision data. At this time, comparing the threshold voltage section S5 to the threshold voltage section S3, the overlap part between the threshold voltage distributions D21 and D22 in the threshold voltage section S5 is smaller than that in the threshold voltage section S3. Thus, the possibility that error bits will occur in the threshold voltage section S5 may be lower than that in the threshold voltage section S3, but correspond to the reliability value having the smallest absolute value or "0". As a result, the reliability values may not normally reflect the reliability of the soft decision data, and the soft decision decoding operation based on the appropriate reliability values may fail.

In accordance with the present embodiment, the direction and extent that the first read voltage HR is out of the ideal read voltage IR2 may be set to a displacement value, and the reliability value may be adjusted based on the displacement value. Therefore, the performance of the soft-decision decoding operation can be improved.

Figure 6:
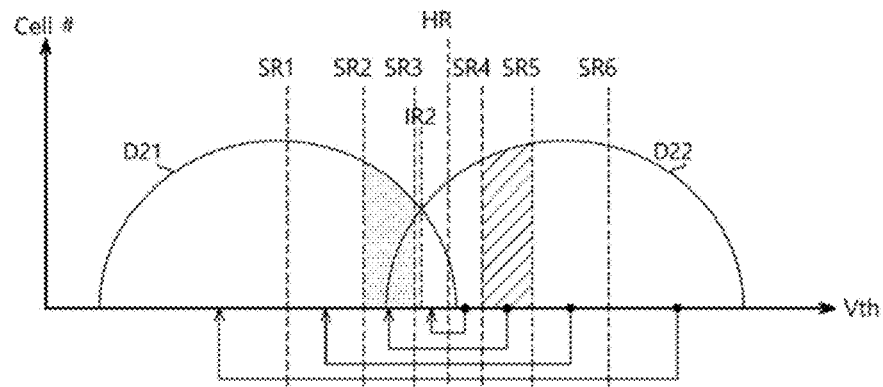
FIG. 6 is a diagram illustrating a first reliability value adjusting operation of a reliability value generation unit shown in FIG. 1.

FIG. 6 is a diagram illustrating the first reliability value adjusting operation of the reliability value generation unit 110 of FIG. 1. For illustration purposes only, FIG. 6 illustrates the first read voltage HR which is out of the ideal read voltage IR2 of the threshold voltage distributions D21 and D22 to the right side, and the second read voltages SR1 to SR6 based on the first read voltage HR.

Referring to FIG. 6, the memory cell counter 111 of FIG. 1 may determine section information regarding the threshold voltage sections S1 to S8. The section information may indicate the number of memory cells positioned in the corresponding threshold voltage section hereafter, referred to as "section memory cell number". The section information may correspond to the area of the threshold voltage distributions D21 and D22 positioned in the corresponding threshold voltage section.

As described above, the controller 100 may acquire soft decision data from memory cells through a read operation using the second read voltages SR1 to SR6. The memory cell counter 111 may determine where the memory cells are positioned in the threshold voltage sections S1 to S8, based on the soft decision data. That is, the memory cell counter 111 may determine respective section information regarding the threshold voltage sections S1 to S8, that is, the section memory cell numbers SC1 to SC8, based on the soft decision data.

Specifically, the memory cell counter 111 may determine the respective section memory cell numbers or section information SC1 to SC8 regarding the threshold voltage sections S1 to S8 by deciding the numbers of memory cells having a smaller threshold voltage than the corresponding second read voltages SR1 to SR6. For example, the controller 100 may decide the number of memory cells having a smaller threshold voltage than the second read voltage SR1, based on soft decision data acquired by applying the second read voltage SR1 to the memory cells, in order to determine the section memory cell number SC1 regarding the threshold voltage section S1. Furthermore, the controller 100 may decide the number of memory cells having a smaller threshold voltage than the second read voltage SR2, based on soft decision data acquired by applying the second read voltage SR1 to the memory cells, and subtract the section memory cell number SC1 regarding the threshold voltage section S1 from the corresponding number, in order to determine the section memory cell number SC2 regarding the threshold voltage section S2.

In an embodiment, the section information may include a value corresponding to the area of the threshold voltage distributions D21 and D22 positioned in the corresponding threshold voltage section, in addition to the section memory cell number. However, the following descriptions will be focused on the case in which the section information indicates the section memory cell number.

The displacement value decision unit 112 may determine the first displacement value of the first read voltage HR based on the section information. In some embodiments, the first displacement value may reflect the direction and extent that the first read voltage HR is out of the ideal read voltage IR2. The displacement value decision unit 112 may determine the first displacement value by comparing section information of at least one pair selected from the threshold voltage sections S1 to S8. Here, the pair may indicate two threshold voltage sections which are symmetrical with each other based on the first read voltage HR. For example, the threshold voltage sections S4 and S5 may constitute one pair, and the threshold voltage sections S3 and S6 may constitute one pair. For illustration purposes only, FIG. 6 illustrates four pairs, each of which is connected through a point and arrow.

Continuously, at least one pair, for example, the pair of the threshold voltage sections S3 and S6 may be selected among the threshold voltage sections S1 to S8, in order to determine the first displacement value. The first displacement value may correspond to a difference between the section memory cell numbers SC3 and SC6 of the selected threshold voltage sections S3 and S6.

At this time, when the first read voltage HR is positioned out of the ideal read voltage IR2 to the right side as illustrated in FIG. 6, the section memory cell number SC6 regarding the selected right threshold voltage section S6 may be greater than the section memory cell number SC3 regarding the left threshold voltage section S3. That is, an area filled with lines may be larger than an area filled with dots. Furthermore, as the first read voltage HR is away from the ideal read voltage IR2, the difference between the section memory cell number SC6 regarding the threshold voltage section S6 and the section memory cell number SC3 regarding the threshold voltage section S3 may increase.

Therefore, the reliability value adjusting unit 113 may determine that the first read voltage HR is out of the ideal read voltage IR2 to the right side, based on the sign of the first displacement value, and determine the adjustment direction to the right side. The reliability value adjusting unit 113 may adjust at least one reliability value of the threshold voltage sections S5 to S8 positioned in the adjustment direction or the right side from the first read voltage HR. Specifically, the at least one reliability value of the threshold voltage sections S5 to S8 may be adjusted to a greater absolute value than the preset absolute value. For example, the reliability value of the threshold voltage section S5 may be adjusted to a value "1" greater than the preset absolute value "0", the reliability value of the threshold voltage section S6 may be adjusted to a value "2" greater than the preset absolute value "1", and the reliability value of the threshold voltage section S7 may be adjusted to a value "3" greater than the preset absolute value "2". That is, since the threshold voltage sections S5 to S8 positioned in the adjustment direction are away from the ideal read voltage IR2, the threshold voltage sections S5 to S8 may correspond to higher reliabilities.

For illustration purposes only, FIG. 6 shows that the reliability value ranges from "−3" to "3", but the range of the reliability value may be expanded.

Figure 7:
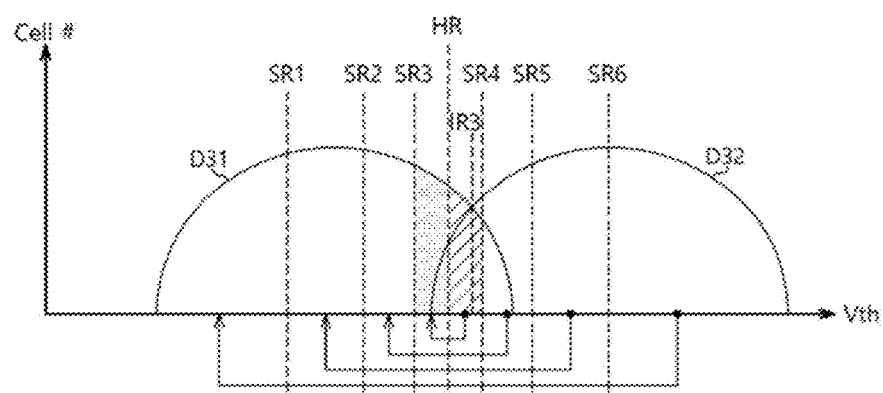
FIG. 7 is a diagram illustrating a first reliability value adjusting operation of a reliability value generation unit shown in FIG. 1.

FIG. 7 is a diagram illustrating a first reliability value adjusting operation of a reliability value generation unit 110 of FIG. 1. For illustration purposes only, FIG. 7 illustrates a first read voltage HR which is out of an ideal read voltage IR3 of threshold voltage is distributions D31 and D32 to the left side, and second read voltages SR1 to SR6 based on the first read voltage HR.

Referring to FIG. 7, the memory cell counter 111 of FIG. 1 may determine respective section memory cell numbers SC1 to SC8 regarding threshold voltage sections S1 to S8 to section information in the same manner as described with reference to FIG. 6.

The displacement value decision unit 112 may determine a first displacement value of the first read voltage HR based on the section memory cell numbers SC1 to SC8. The displacement value decision unit 112 may select the pair of the threshold voltage sections S4 and S5, for example, and determine a difference between the section memory cell numbers SC4 and SC5 regarding the threshold voltage sections S4 and S5 to the first displacement value.

The reliability value adjusting unit 113 may determine that the first read voltage HR is out of the ideal read voltage IR3 to the left side, based on the sign of the first displacement value, and determine the adjustment direction to the left side. The reliability value adjusting unit 113 may adjust at least one reliability value of the threshold voltage sections S1 and S4 positioned in the adjustment direction or the left side from the first read voltage HR. That is, the one reliability value of the threshold voltage sections S1 to S4 may be adjusted to a greater absolute value than the preset absolute value. For example, the reliability value of the threshold voltage section S2 may be adjusted to a value "−3" from a value "−2", the reliability value of the threshold voltage section S3 may be adjusted to a value "−1" from a value "−2", and the reliability value of the threshold voltage section S4 may be adjusted to a value "−1" from a value "0".

In an embodiment, when the first displacement value of the first read voltage HR is very small, for example, when the first displacement value of the first read voltage HR is smaller than the first threshold value, the reliability value generation unit 110 may not perform the first reliability value adjusting operation. When the first displacement value is very small, it may indicate that the first read voltage HR is not significantly out of the ideal read voltage. Thus, the preset reliability value may not need to be adjusted.

In an embodiment, when the first displacement value of the first read voltage HR based on a pair of threshold voltage sections is very small, for example, when the first displacement value of the first read voltage HR is smaller than the first threshold value, the displacement value decision unit 112 may recalculate the first displacement value based on another pair of threshold voltage sections.

In an embodiment, the pair of the threshold voltage sections for determining the first displacement value of the first read voltage HR may correspond to the pair which is the closest to the first read voltage HR. That is, the controller 100 may select the pair of the threshold voltage sections S4 and S5 in order to determine the first displacement value of the first read voltage HR.

In an embodiment, the controller 100 may select two or more pairs of threshold voltage sections, add up the section memory cell numbers regarding the left threshold voltage sections, add up the section memory cell numbers regarding the right threshold voltage sections, and determine the first displacement value of the first read voltage HR based on a difference between the addition results.

In an embodiment, the memory cell counter 111 may not determine all of the section memory cell numbers SC1 to SC8, but selectively determine only section memory cell numbers required for determining the first displacement value of the first read voltage HR.

Figure 8:
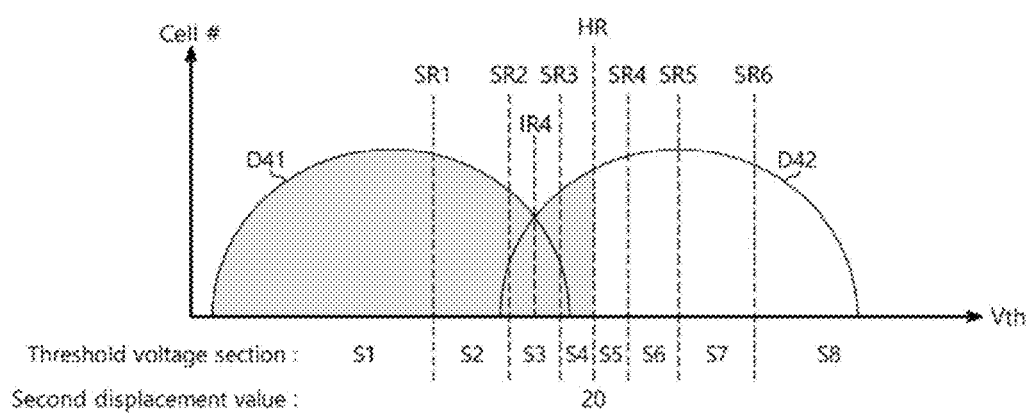
FIG. 8 is a diagram illustrating a second displacement value of a first read voltage.

FIG. 8 is a diagram illustrating a second displacement value of a first read voltage HR. For illustration purposes only, FIG. 8 illustrates the first read voltage HR which is significantly out of an ideal read voltage IR4 of threshold voltage distributions D41 and D42 to the right side, and the second read voltages SR1 to SR6 based on the first read voltage HR.

Referring to FIG. 8, the displacement value decision unit 112 shown in FIG. 1 may determine the second displacement value of the first read voltage HR in order to perform a reliability adjusting operation with more precision. In some embodiments, the second displacement value of the first read voltage HR may indicate a ratio of a difference between the actual number of memory cells having a smaller threshold voltage than the first read voltage HR and a reference number with respect to a unit number. The actual number of memory cells may indicate the number of memory cells positioned in a shaded part of FIG. 8. The unit number may indicate the number of memory cells which are expected to be positioned in a single threshold voltage distribution, under the supposition that the threshold voltage distributions D41 and D42 are uniform or the memory cells are uniformly distributed in the threshold voltage distributions D41 and D42. The reference number may indicate the number of memory cells which are expected to have a smaller threshold voltage than the first read voltage HR, under the supposition that the threshold voltage distributions D41 and D42 are uniform and the first read voltage HR is the ideal read voltage IR4. The actual number of memory cells having a smaller threshold voltage than the first read voltage HR may be calculated by the memory cell counter 111.

In short, the second displacement value may be determined by the following equation. The second displacement value may be calculated as a percentage, and FIG. 8 exemplifies the second displacement value as "20";

Second displacement value={(Number of memory cells having smaller threshold voltage than first read voltage HR−Reference number)/Unit number}×100.

The second displacement value may have the following characteristics. As illustrated in FIG. 8, when the first read voltage HR is positioned at the right side of the ideal read voltage IR4, the second displacement value may be a positive value. On the other hand, when the first read voltage HR is positioned at the left side of the ideal read voltage IR4, the second displacement value may be a negative number. Furthermore, as the first read voltage HR is far away from the ideal read voltage IR4, the second displacement value may have a larger absolute value. Therefore, the second displacement value may reflect how far away the first read voltage HR is from the ideal read voltage IR4, more directly than the first displacement value.

Figure 9:
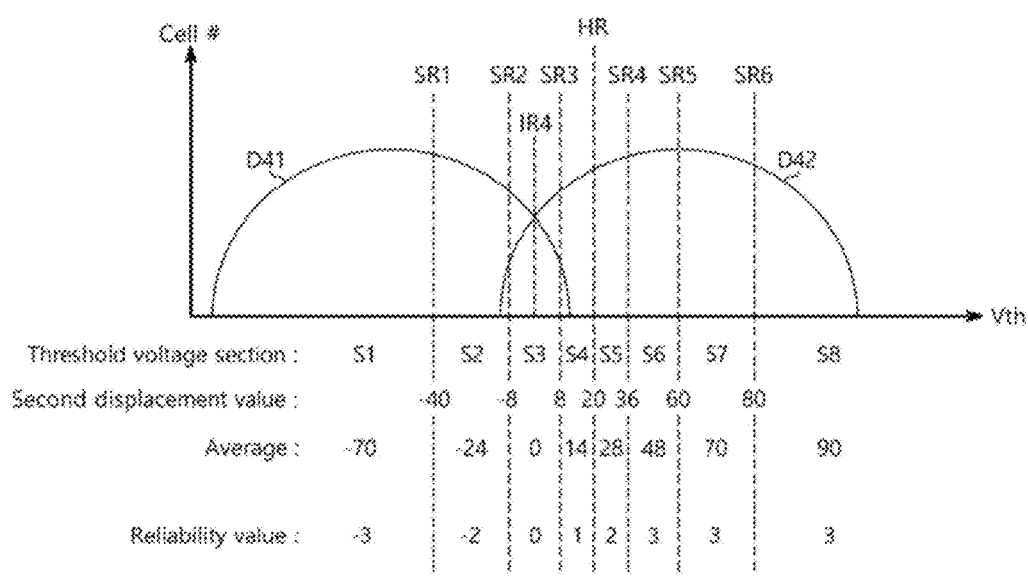
FIG. 9 is a diagram illustrating a second reliability value adjusting operation of a reliability value generation unit shown in FIG. 1.

FIG. 9 is a diagram illustrating a second reliability value adjusting operation of a reliability value generation unit 110 of FIG. 1. For illustration purposes only, FIG. 9 illustrates the threshold voltage distributions D41 and D42, the first read voltage HR, and the second read voltages SR1 to SR6 based on the first read voltage HR, which are illustrated in FIG. 8.

The reliability value adjusting unit 113 shown in FIG. 1 may perform the first reliability value adjusting operation when the second displacement value of the first read voltage HR is less than a second threshold value. That is, as described above, the reliability value adjusting unit 113 may determine the adjustment direction to the direction in which the first read voltage HR is out of the ideal read voltage IR4, that is, the right side, based on the sign of the second displacement value, and adjust at least one reliability value of the threshold voltage sections S5 to S8 positioned in the adjustment direction from the ideal read voltage IR4.

However, the reliability value adjusting unit 113 may perform the second reliability value adjusting operation instead of the first reliability value adjusting operation, when the second displacement value of the first read voltage HR is greater than or equal to the second threshold value. For example, when the second threshold value is "20", the reliability value adjusting unit 113 may perform the second reliability value adjusting operation since the second displacement value "20" of the first read voltage HR is equal to the second threshold value.

Specifically, the reliability value adjusting unit 113 may first determine the second displacement values of the second read voltages SR1 to SR6. The second displacement values of the second read voltages SR1 to SR6 may be determined in the same manner as the second displacement value of the first read voltage HR. For example, the second displacement value of the second read voltage SR1 may indicate a ratio of a difference between the actual number of memory cells having a smaller threshold voltage than the second read voltage SR1 and the reference number with respect to the unit number. The second displacement value may be determined to be "−40".

The reliability value adjusting unit 113 may determine the average of the second displacement values of the threshold voltage sections S1 to S8. The average of second displacement values for a certain threshold voltage section may correspond to the average of second displacement values determined at the edges of the corresponding threshold voltage section. For example, the average of the second displacement values for the threshold voltage section S2 may correspond to "−24" which is the average of the respective second displacement values "−40" and "−8" of the second read voltages SR1 and SR2. According to the definition of the second displacement value, the second displacement value corresponding to the left edge in the leftmost threshold voltage section S1 may be determined to be "−100", and the second displacement value corresponding to the right edge in the rightmost threshold voltage section S8 may be determined to be "100". Thus, the average of the second displacement values for each of the threshold voltage sections S1 and S8 may also be determined.

The reliability value adjusting unit 113 may adjust the respective reliability values of the threshold voltage sections S1 to S8 according to the average of the second displacement values, based on a reliability value adjustment table RLT. In some embodiments, the reliability value adjustment table RLT may be implemented within the reliability value adjusting unit 113. The reliability value adjusting unit 113 may allocate a reliability value corresponding to the average of the second displacement values in the reliability value adjustment table RLT to the corresponding threshold voltage section among the threshold voltage sections S1 to S8. For example, since the average "−24" of the second displacement values for the threshold voltage section S2 is included in a section of "−30" to "−20" in the reliability value adjustment table RLT, the reliability value adjusting unit 113 may map a reliability value "−2" to the threshold voltage section S2.

The reliability value adjustment table RLT may include preset reliability values corresponding to predetermined average sections for the second displacement values. The average of the second displacement values may have the same characteristic as the second displacement value. Specifically, as the average of the second displacement values has a small absolute value, the corresponding threshold voltage section may be close to the ideal read voltage IR4, and generate many error bits. Thus, the average of second displacement values having a small absolute value in the reliability value adjustment table RLT may correspond to a reliability value having a small absolute value. Therefore, as the threshold voltage section is close to the ideal read voltage IR4, the threshold voltage section may correspond to a reliability value having a small absolute value.

For illustration purposes only, the reliability value adjustment table RLT may include seven average sections for the second displacement values, but the number of sections is not limited thereto.

Figure 10:
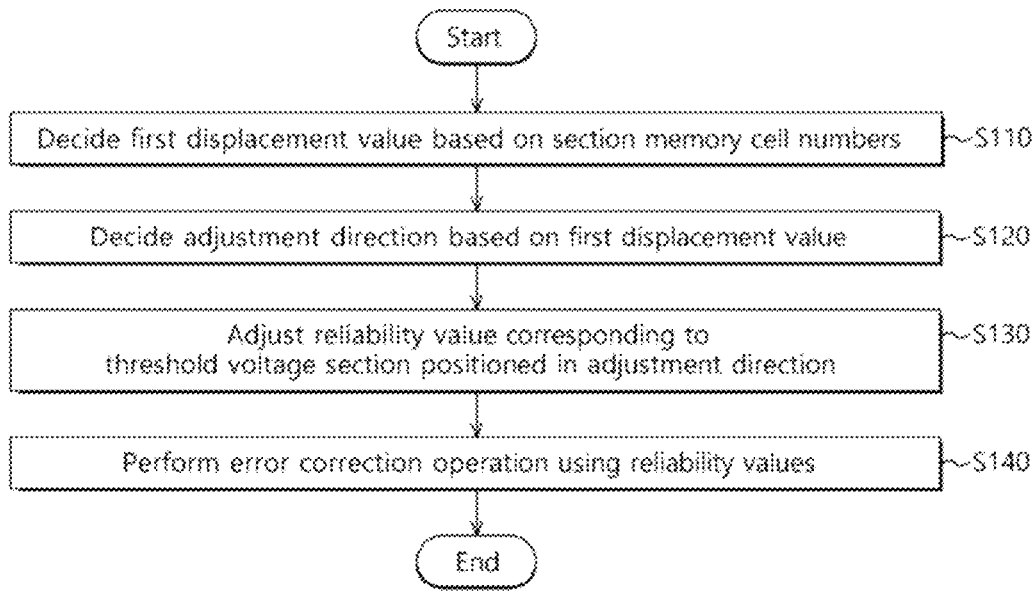
FIG. 10 is a flowchart illustrating an operating method for a data storage device shown in FIG. 1.

FIG. 10 is a flowchart illustrating an operating method for a data storage device 10 of FIG. 1.

At step S110, the displacement value decision unit 112 may decide the first displacement value based on section memory cell numbers regarding threshold voltage sections divided by the first read voltage and the second read voltages. The memory cell counter 111 may decide the section memory cell numbers based on data read from the memory cells, using the first read voltage and the second read voltages.

At step S120, the reliability value adjusting unit 113 may decide an adjustment direction based on the first displacement value. The adjustment direction may indicate the direction in which the first read voltage is out of the ideal read voltage.

At step S130, the reliability value adjusting unit 113 may adjust at least one reliability value corresponding to at least one threshold voltage section positioned in the adjustment direction from the first read voltage. Specifically, the reliability value adjusting unit 113 may adjust the at least one reliability value by increasing the absolute values of the at least one reliability value.

At step S140, the error correction unit 120 may perform an error correction operation on the data read from the memory cells based on the first read voltage, using the at least one reliability value corresponding to the at least one threshold voltage section.

Figure 11:
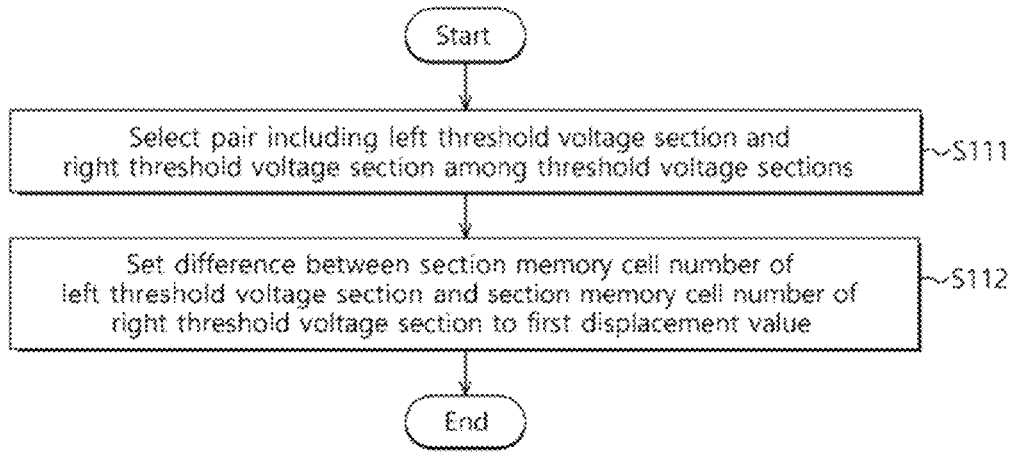
FIG. 11 is a flowchart illustrating an operating method for a displacement value decision unit shown in FIG. 1.

FIG. 11 is a flowchart illustrating an operating method for the displacement value decision unit 112 of FIG. 1. The operating method of FIG. 11 may correspond to a specific embodiment of step S110 in FIG. 10.

At step S111, the displacement value decision unit 112 may select at least one pair including at least one left threshold voltage section and at least one right threshold voltage section among the threshold voltage sections.

At step S112, the displacement value decision unit 112 may set a difference between the section memory cell number regarding the at least one left threshold voltage section and the section memory cell number regarding the at least one right threshold voltage section to the first displacement value.

Figure 12:
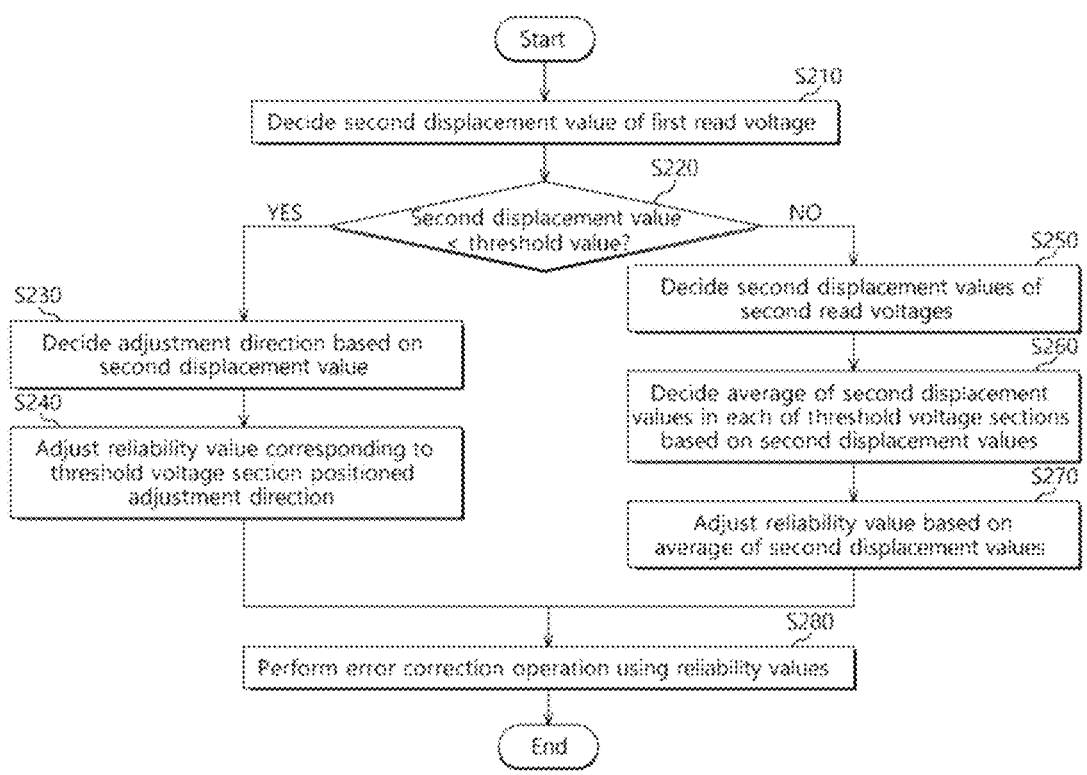
FIG. 12 is a flowchart illustrating another operating method for a data storage device shown in FIG. 1.

FIG. 12 is a flowchart illustrating another operating method for the data storage device 10 of FIG. 1.

At step S210, the displacement value decision unit 112 may decide a second displacement value of the first read voltage, based on a first number. In some embodiments, the first number may be the number of memory cells having a smaller threshold voltage than the first read voltage. Specifically, the displacement value decision unit 112 may determine a ratio of a difference between the first number and the reference number with respect to the unit number to the second displacement value. The reference number may indicate the number of memory cells which are expected to have a smaller threshold voltage than the first read voltage, under the supposition that the threshold voltage distributions of the memory cells are uniform and the first read voltage is the ideal read voltage. The unit number may indicate the number of memory cells which are expected to be positioned in a single threshold voltage distribution, under the supposition that the threshold voltage distributions are uniform.

At step S220, the procedure may be performed depending on whether the second displacement value is less than the threshold value. Specifically, when the second displacement value is less than the threshold value, the procedure may proceed to step S230.

At step S230, the reliability value adjusting unit 113 may decide the adjustment direction based on the second displacement value. The adjustment direction may indicate the direction in which the first read voltage is out of the ideal read voltage.

At step S240, the reliability value adjusting unit 113 may adjust at least one reliability value corresponding to at least one threshold voltage section positioned in the adjustment direction from the first read voltage among the threshold voltage sections divided by the second read voltages.

On the other hand, when the second displacement value is greater than or equal to the second threshold value at step S220, the procedure may proceed to step S250.

At step S250, the reliability value adjusting unit 113 may decide the second displacement values of the second read voltages.

At step S260, the reliability value adjusting unit 113 may decide the average of the second displacement values in each of the threshold voltage sections, based on the second displacement values.

At step S270, the reliability value adjusting unit 113 may adjust at least one reliability value corresponding to the threshold voltage sections based on the average of the second displacement values. The reliability value adjusting unit 113 may adjust the at least one reliability value by referring to the preset reliability values corresponding to the average sections for the second displacement values.

At step S280, the error correction unit 120 may perform an error correction operation on data read from the memory cells based on the first read voltage, using the reliability values corresponding to the threshold voltage sections.

Figure 13:
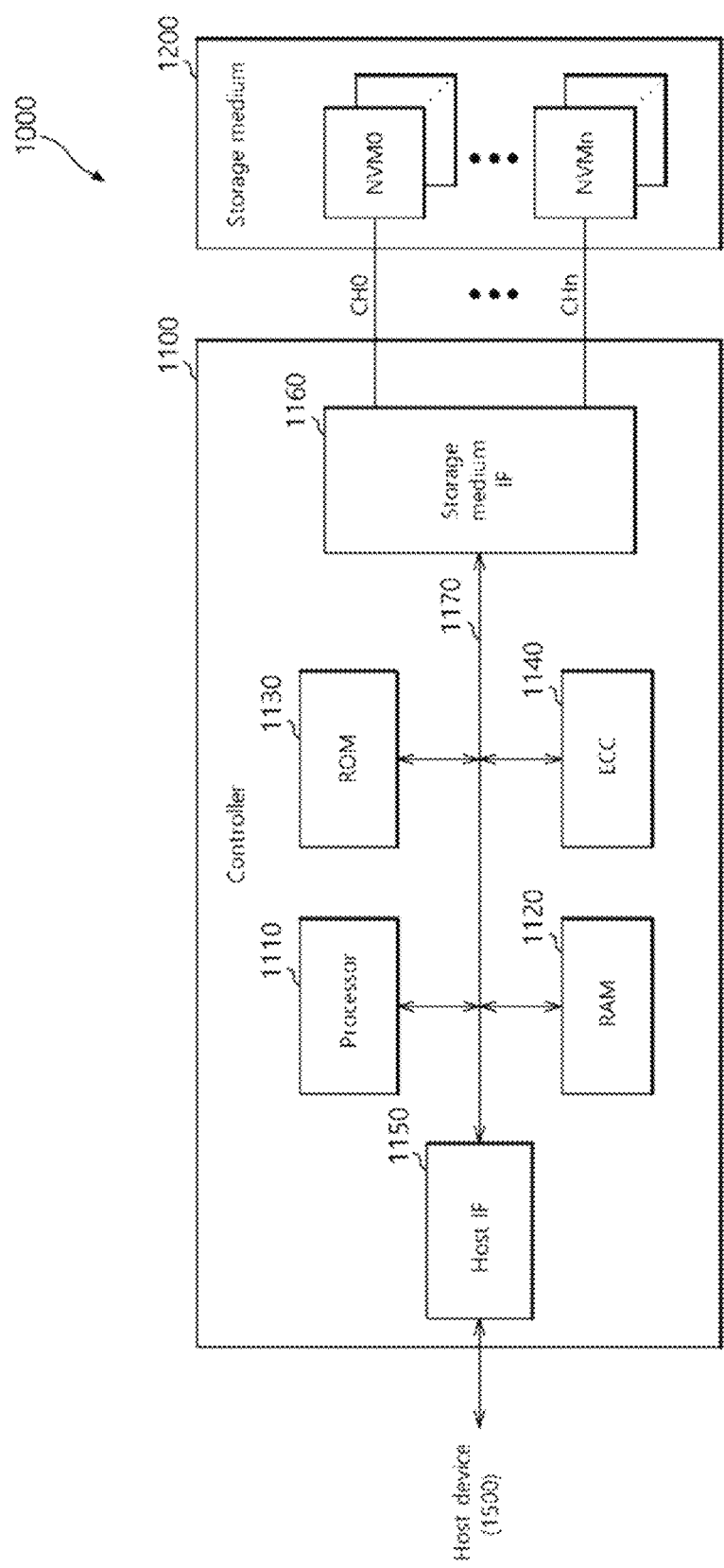
FIG. 13 is a block diagram illustrating a solid state drive (SSD) in accordance with an embodiment.

FIG. 13 is a block diagram illustrating a solid state drive (SSD) 1000 in accordance with an embodiment.

Referring to FIG. 13, the SSD 1000 may include a controller 1100 and a storage medium 1200.

The controller 1100 may control data exchange between a host device 1500 and the storage medium 1200. The controller 1100 may include a processor 1110, a random access memory (RAM) 1120, a read only memory (ROM) 1130, an error correction code (ECC) unit 1140, a host interface (IF) 1150 and a storage medium interface (IF) 1160, which are connected through an internal bus 1170.

The processor 1110 may control overall operations of the controller 1100. The processor 1110 may store data in the storage medium 1200 according to a data processing request of the host device 1500, and read the stored data from the storage medium 1200. The processor 1110 may control an internal operation of the SSD 1000, such as a merge operation or wear leveling operation, in order to efficiently manage the storage medium 1200.

The RAM 1120 may store programs and program data which are used by the processor 1110. The RAM 1120 may temporarily store data received from the host interface 1150 before the data are transmitted to the storage medium, and temporarily store read data from the storage medium 1200 before the data are transmitted to the host device 1500.

The ROM 1130 may store a program code read by the processor 1110. The program code may include commands processed by the processor 1110, in order for the processor 1110 to control internal units of the controller 1100.

The ECC unit 1140 may encode data to be stored in the storage medium 1200, and decode data read from the storage medium 1200. The ECC unit 1140 may detect and correct an error in data, according to an ECC algorithm.

The ECC unit 1140 may include the reliability value generation unit 110 and the error correction unit 120, which are illustrated in FIG. 1. That is, the ECC unit 1140 may perform the operations of the reliability value generation unit 110 and the error correction unit 120 in substantially the same manner as described with reference to FIG. 1.

The host interface 1150 may exchange a data processing request and data with the host device 1500.

The storage medium interface 1160 may transmit a control signal and data to the storage medium 1200. The storage medium interface 1160 may receive data from the storage medium 1200. The storage medium interface 1160 may be connected to the storage medium 1200 through a plurality of channels CH0 to CHn.

The storage medium 1200 may include a plurality of nonvolatile memory devices NVM0 to NVMn. Each of the nonvolatile memory device NVM0 to NVMn may perform a write operation and read operation according to control of the controller 1100.

Figure 14:
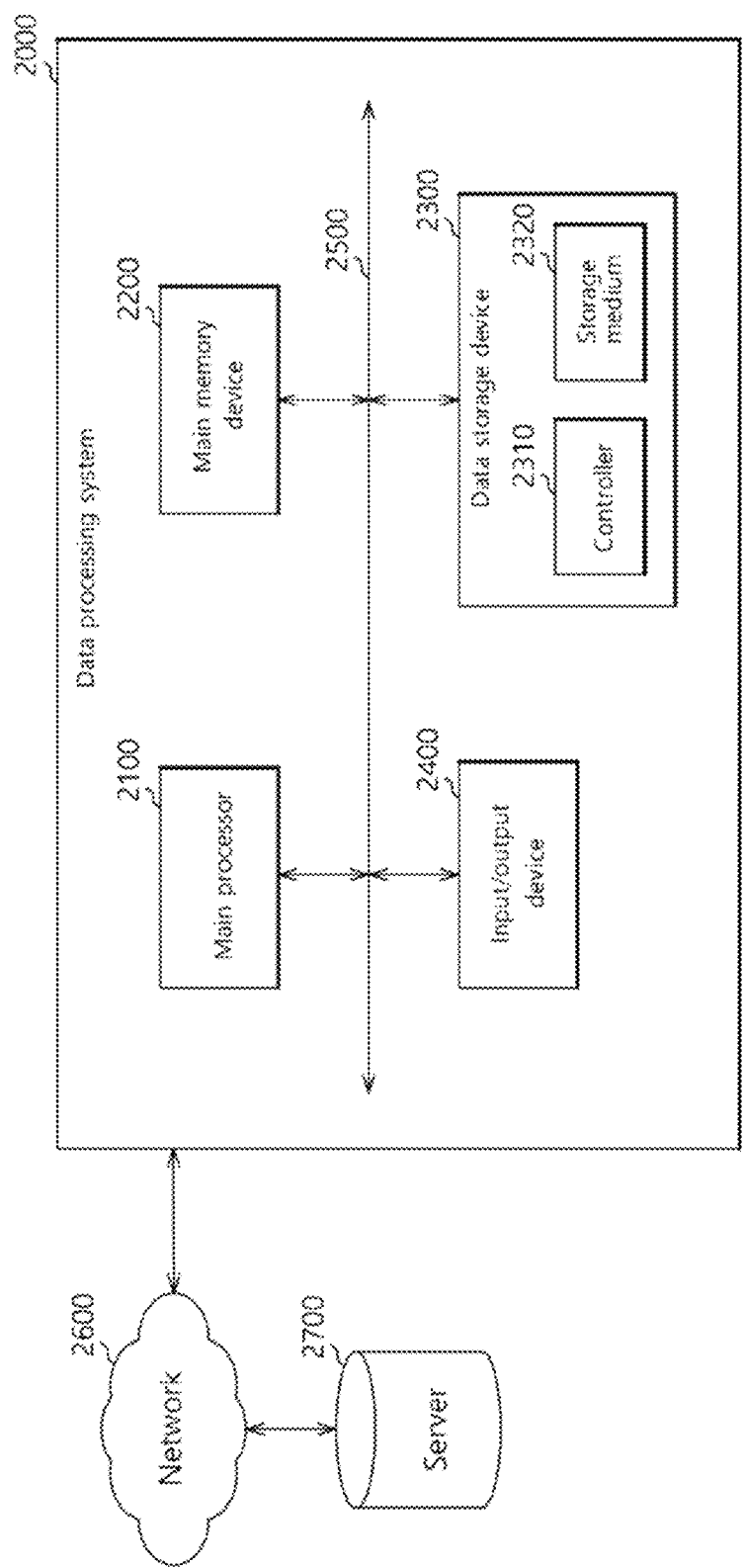
FIG. 14 is a block diagram illustrating a data processing system to which the data storage device in accordance with the present embodiment is applied.

FIG. 14 is a block diagram illustrating a data processing system 2000 to which the data storage device 10 shown in FIG. 1 in accordance with the present embodiment is applied.

Referring to FIG. 14, the data processing system 2000 may include a computer, laptop computer, netbook computer, smart phone, digital television (TV), digital camera and navigation system. The data processing system 2000 may include a main processor 2100, a main memory device 2200, a data storage device 2300 and an input/output device 2400. The internal units of the data processing system 2000 may exchange control signals and data through a system bus 2500.

The main processor 2100 may control overall operations of the data processing system 2000. The main processor 2100 may include a central processing unit (CPU) such as a microprocessor, for example. The main processor 2100 may execute various pieces of software, such as an operating system, application and device driver, on the main memory device 2200.

The main memory device 2200 may store programs and program data which are used by the main processor 2100. The main memory device 2200 may temporarily store data which are to be transmitted to the data storage device 2300 and the input/output device 2400.

The data storage device 2300 may include a controller 2310 and a storage medium 2320. The data storage device 2300 may be configured and operated in substantially the same manner as the data storage device 10 of FIG. 1.

The input/output device 2400 may include a keyboard, scanner, touch screen, screen monitor, printer and mouse, which are capable of exchanging information with a user. For example, the input/output device 2400 may receive a command for controlling the data processing system 2000 from the user, or provide a processed result to the user.

In an embodiment, the data processing system 2000 may communicate with one or more servers 2700 through a network 2600 such as local area network (LAN), wide area network (WAN) or wireless network. The data processing system 2000 may include a network interface (not illustrated) to connect to the network 2600.

While various embodiments have been described above, it will be understood to those skilled in the art that the embodiments described are examples only. Accordingly, the data storage device and the operating method thereof described herein should not be limited to the described embodiments. It will be apparent to those skilled in the art to which the present invention pertains that various other changes and modifications may be made without departing from the spirit and scope of the invention as defined in the following claims.

What is claimed is:

1. An operating method for a data storage device, comprising:
    determining a displacement value of a first read voltage, based on a number of memory cells each having a threshold voltage less than the first read voltage;
    determining displacement values of second read voltages, when the displacement value is greater than a threshold value;
    determining an average of displacement values corresponding to each of a plurality of threshold voltage sections divided by the second read voltages, based on the displacement values;
    adjusting at least one reliability value corresponding to at least one threshold voltage section among the threshold voltage sections, based on the average; and
    performing an error correction operation on data read from the memory cells based on the first read voltage, using reliability values corresponding to the threshold voltage sections.

2. The operating method of claim 1, wherein the determining of the displacement value comprises determining a ratio of a difference between the number of memory cells and a reference number with respect to a unit number, as the displacement value, and
    wherein the reference number includes a number of memory cells which are expected to have the threshold voltage less than the first read voltage, when threshold voltage distributions of the memory cells are uniform and the first read voltage is an ideal read voltage, and the unit number includes a number of memory cells which are expected to be positioned in a single threshold voltage distribution, when the threshold voltage distributions are uniform.

3. The operating method of claim 2, wherein the ideal read voltage includes a read voltage to minimize error bits for the data.

4. The operating method of claim 1, wherein the determining of the average comprises determining the average of displacement values corresponding to each of the threshold voltage sections, based on the displacement value and the displacement values.

5. The operating method of claim 4, wherein the adjusting of the reliability value among the threshold voltage sections, based on the average comprises adjusting the reliability value by referring to a preset reliability value corresponding to an average section including the average among a plurality of average sections.

6. The operating method of claim 1, further comprising:
    determining an adjustment direction based on the displacement value, when the displacement value is less than the threshold value; and
    adjusting the at least one reliability value corresponding to the at least one threshold voltage section positioned in the adjustment direction from the first read voltage among the threshold voltage sections;
    wherein the adjustment direction comprises a direction in which the first read voltage is out of an ideal read voltage.

7. The operating method of claim 6, wherein the ideal read voltage includes a read voltage to minimize error bits for the data.

8. The operating method of claim 6, wherein the adjusting of the reliability value corresponding to the at least one threshold voltage section positioned in the adjustment direction from the first read voltage among the threshold voltage sections comprises increasing an absolute value of the reliability value.

9. The operating method of claim 1, wherein the determining of the displacement values comprises determining a ratio of a difference between a number of memory cells each having a threshold voltage less than the second read voltages and a reference number with respect to a unit number, as displacement values of the second read voltages, and
    wherein the reference number includes a number of memory cells which are expected to have the threshold voltage less than the first read voltage, when threshold voltage distributions of the memory cells are uniform and the first read voltage is an ideal read voltage, and
    wherein the unit number includes a number of memory cells which are expected to be positioned in a single threshold voltage distribution, when the threshold voltage distributions are uniform.

10. A storage device comprising:
    a nonvolatile memory device comprising a plurality of memory cells; and
    a controller configured to;
    determine a displacement value of a first read voltage, based on a number of memory cells each having a threshold voltage less than the first read voltage,
    determine displacement values of second read voltages, when the displacement value is greater than a threshold value,
    determine an average of displacement values corresponding to each of a plurality of threshold voltage sections divided by the second read voltages, based on the displacement values, adjust at least one reliability value corresponding to at least one threshold voltage section among the threshold voltage sections, based on the average, and perform an error correction operation on data read from the memory cells based on the first read voltage, using reliability values corresponding to the threshold voltage sections.

11. The storage device of claim 10, wherein the controller is configured to determine a ratio of a difference between the number of memory cells and a reference number with respect to a unit number, as the displacement value, wherein the reference number includes a number of memory cells which are expected to have the threshold voltage less than the first read voltage, when threshold voltage distributions of the memory cells are uniform and the first read voltage is an ideal read voltage, and the unit number includes a number of memory cells which are expected to be positioned in a single threshold voltage distribution, when the threshold voltage distributions are uniform.

12. The storage device of claim 11, wherein the ideal read voltage includes a read voltage to minimize error bits for the data.

13. The storage device of claim 10, wherein the controller is configured to determine the average of displacement values corresponding to each of the threshold voltage sections, based on the displacement value and the displacement values.

14. The storage device of claim 13, wherein the controller is configured to adjust the reliability value by referring to a preset reliability value corresponding to an average section including the average among a plurality of average sections.

15. The storage device of claim 10, wherein the controller is further configured to determine an adjustment direction based on the displacement value, when the displacement value is less than the threshold value, and adjust the at least one reliability value corresponding to the at least one threshold voltage section positioned in the adjustment direction from the first read voltage among the threshold voltage sections, wherein the adjustment direction comprises a direction in which the first read voltage is out of an ideal read voltage.

16. The storage device of claim 15, wherein the ideal read voltage includes a read voltage to minimize error bits for the data.

17. The storage device of claim 15, wherein the controller is further configured to increase an absolute value of the reliability value.

18. The storage device of claim 10, wherein the controller is configured to determine a ratio of a difference between a number of memory cells each having a threshold voltage less than the second read voltages and a reference number with respect to a unit number, as displacement values of the second read voltages, and wherein the reference number includes a number of memory cells which are expected to have a threshold voltage less than the first read voltage, when threshold voltage distributions of the memory cells are uniform and the first read voltage is an ideal read voltage, and wherein the unit number includes a number of memory cells which are expected to be positioned in a single threshold voltage distribution, when the threshold voltage distributions are uniform.

* * * * *